(12) United States Patent
Litsyn et al.

(10) Patent No.: US 7,990,766 B2
(45) Date of Patent: Aug. 2, 2011

(54) MULTI-BIT-PER-CELL FLASH MEMORY DEVICE WITH NON-BIJECTIVE MAPPING

(75) Inventors: Simon Litsyn, Giv'at Shmuel (IL); Eran Sharon, Rishon Lezion (IL); Idan Alrod, Herzliya (IL)

(73) Assignee: Ramot at Tel Aviv University Ltd., Tel Aviv (IL)

( * ) Notice: Subject to any disclaimer, the term of this patent is extended or adjusted under 35 U.S.C. 154(b) by 0 days.

(21) Appl. No.: 12/612,733

(22) Filed: Nov. 5, 2009

(65) Prior Publication Data

US 2010/0070692 A1 Mar. 18, 2010

Related U.S. Application Data

(62) Division of application No. 12/045,733, filed on Mar. 11, 2008, now Pat. No. 7,643,342, which is a division of application No. 11/540,560, filed on Oct. 2, 2006, now Pat. No. 7,388,781.

(60) Provisional application No. 60/779,044, filed on Mar. 6, 2006.

(51) Int. Cl.
  *G11C 11/34* (2006.01)
  *G11C 16/04* (2006.01)
  *G06F 13/00* (2006.01)
(52) U.S. Cl. ............... 365/185.03; 365/185.28; 711/103
(58) Field of Classification Search ............. 365/185.03, 365/185.28; 711/103
See application file for complete search history.

(56) References Cited

U.S. PATENT DOCUMENTS

| | | | |
|---|---|---|---|
| 5,404,485 A | 4/1995 | Ban | |
| 5,479,624 A * | 12/1995 | Lee | .................................. 711/1 |
| 5,541,886 A | 7/1996 | Hasbun | |
| 5,930,167 A | 7/1999 | Lee et al. | |
| 6,304,657 B1 * | 10/2001 | Yokota et al. | ................... 380/28 |
| 6,469,931 B1 | 10/2002 | Ban et al. | |
| 6,522,580 B2 | 2/2003 | Chen et al. | |
| 6,643,188 B2 | 11/2003 | Tanaka et al. | |
| 6,847,550 B2 | 1/2005 | Park | |
| 7,388,781 B2 | 6/2008 | Litsyn et al. | |
| 2005/0057995 A1 | 3/2005 | Mitani et al. | |
| 2005/0119988 A1* | 6/2005 | Buch et al. | ........................ 707/1 |
| 2006/0010296 A1* | 1/2006 | Dent | .............................. 711/147 |
| 2007/0150694 A1* | 6/2007 | Chang et al. | ................... 711/202 |
| 2007/0234183 A1 | 10/2007 | Hwang et al. | |
| 2007/0252192 A1* | 11/2007 | Mokhlesi et al. | ............. 257/315 |
| 2008/0239829 A1* | 10/2008 | Banks | ....................... 365/185.29 |
| 2009/0029511 A1* | 1/2009 | Wu | ................................. 438/261 |
| 2010/0009504 A1* | 1/2010 | Hsu et al. | ....................... 438/259 |

OTHER PUBLICATIONS

R. Gallagher, Information Theory and Reliable Communication, Wiley, New York NY, USA, (1971).

(Continued)

*Primary Examiner* — Ly D Pham
(74) *Attorney, Agent, or Firm* — Mark M. Friedman

(57) ABSTRACT

To store a plurality of input bits, the bits are mapped to a corresponding programmed state of one or more memory cells and the cell(s) is/are programmed to that corresponding programmed state. The mapping may be many-to-one or may be an "into" generalized Gray mapping. The cell(s) is/are read to provide a read state value that is transformed into a plurality of output bits, for example by maximum likelihood decoding or by mapping the read state value into a plurality of soft bits and then decoding the soft bits.

8 Claims, 8 Drawing Sheets

OTHER PUBLICATIONS

S. Lin and D. J. Costello, Error Control Coding: Fundamentals and Applications, Prentice Hall, Englewood Cliffs NJ, USA, 1983.

Y. Nana, E. Sharon and S. Litsyn "Improved Decoding of LDPC Coded Modulations," IEEE Communication Letters, vol. 10. No. 5 pp. 375-377 (2006).

U. Wachsmann, R.F.H Fischer and J.B. Huber, "Multilevel Codes: Theoretical Concepts and Practical Design Rules" IEEE Transactions on Information Theory Vo. 45 No. 5 pp. 1361-1391 (1999).

G. Caire, G. Taricco and E. Biglieri, "Bit Interleaved Coded Modulation"; IEEE Transactions on Information Theory Vo. 44 No. 3 pp. 927-946 (1998).

* cited by examiner

MULTI-BIT-PER-CELL FLASH MEMORY DEVICE WITH NON-BIJECTIVE MAPPING

This is a Continuation of U.S. patent application Ser. No. 12/045,733 filed Mar. 11, 2008, pending, in which is a Divisional of U.S. patent application Ser. No. 11/540,560 filed Oct. 2, 2006, which claims priority of U.S. Provisional Application No. 60/779,044 filed Mar. 6, 2006.

FIELD AND BACKGROUND OF THE INVENTION

The present invention relates to multi-bit-per-cell flash memories.

A simplified block diagram of a Multi-Bit-Per-Cell (MBPC) flash memory device 10 is shown in FIG. 1. Specifically, the two components of flash memory device 10 that are illustrated in FIG. 1 are a flash controller 12 and a flash memory cell array 18.

Flash controller 12 includes two blocks: an encoder block 14 that translates a stream of information bits that the user wishes to store in flash cell array 18 into a stream of states or voltage levels that should be programmed into the cells of flash cell array 18, and a decoder block 16 that translates a stream of cell states or voltage levels read from flash cell array 18 into the stream of information bits that was stored in flash cell array 18.

The cost of a MBPC Flash system is mainly influenced by the size of the flash memory cell array required in order to store a given amount of information, i.e., the number of flash cells required in order to store a given amount of information. It is convenient to use the number of information bits per flash cell (abbreviated as IBPC) as a normalized measure of the flash memory's cost efficiency:

IBPC=(number of information bits stored in the flash memory)÷(number of cells in the flash memory)

One might argue that the IBPC of a MBPC Flash system can be increased simply by increasing the number of states or voltage levels that can be programmed in a flash cell. However a fair comparison should also take into account the MBPC flash reliability and the MBPC flash performance.

The main criterion of flash reliability is the ability of the controller to recover the stored information with high probability, i.e. with a negligible bit error rate. The states or voltage levels that are programmed into the flash cells are not always equal to the states or voltage levels that are read from the flash cells. This is due to physical processes that occur inside the flash cell array that cause the charge stored in the flash cell to change. These harmful physical processes corrupt the information stored in the flash cells. Usually the flash reliability is a function of time and flash cell wear level. The flash reliability is determined primarily by the following factors:
1. Data retention: the expected amount of time that data can be stored in the flash cells and still be recovered with high reliability.
2. Program/Erase cycles: the expected number of times that the flash cells can be programmed and erased while allowing reliable storage of data.

The main criterion of flash performance is the flash read/write throughput, i.e. the throughput of writing data to the flash memory and reading data from the flash memory, measured in information bits per second.

Unfortunately, increasing the number of voltage levels that can be programmed in each flash cell has a negative effect both on the flash memory reliability and on the flash memory performance. For example, as the number of voltage levels increases, the expected data retention time of the flash memory decreases and the expected number of available program/erase cycles decreases, resulting in a lower flash memory reliability. Moreover, the read/write throughput of the flash memory becomes slower with the increase of the number of flash cell voltage levels. Hence there is a tradeoff between the flash memory cost (the IBPC of the flash memory) and the reliability and performance of the flash memory. Obviously, one wishes to optimize this tradeoff. This can be done through an appropriate design of the flash controller.

A simple prior art flash controller uses a bijective mapping, i.e. a mapping that is one-to-one and onto, in order to directly map k information bits into a state or voltage level out of $q=2^k$ states of each flash cell. By allowing only a small number of states q to be programmed in a cell, the probability of the cell to make a transition out of its state is made negligible, providing a reliable flash memory device. Note that such a flash memory device can use only a number of states q in the cell that is a power of 2 because bits are directly mapped to cell states through a bijective mapping.

U.S. Pat. No. 6,847,550, issued Jan. 25, 2005 to Park and entitled "NONVOLATILE SEMICONDUCTOR MEMORY HAVING THREE_LEVEL MEMORY CELLS AND PROGRAM AND READ MAPPING CIRCUITS THERFOR" (hereinafter "Park '550"), describes a method of trading-off Flash cost and reliability by using a non-bijective mapping, that is one-to-one but not onto, from information bits to the states of one or more flash cells. By using the non-bijective mapping, a number of cell states that is not a power of 2 can be used. In the example described in Park '550, three-state cells are used. This provides higher flash reliability compared to a flash memory device based on four-state cells (due to lower transition probability from state to state) and lower cost compared to a flash memory device based on two-state cells.

U.S. Pat. No. 6,469,931, issued Oct. 22, 2002 to Ban et al., entitled "METHOD FOR INCREASING INFORMATION CONTENT IN A COMPUTER MEMORY" (hereinafter "Ban '931"), provides a general framework for reducing the cost of a flash memory device while maintaining the reliability of the flash memory device. This is done by mapping large blocks of K information bits into large blocks of M cells with q states. The encoder block (e.g. encoder block 14 of FIG. 1) implements a mapping function, also known as an Error Correcting Code (ECC), that maps points from the vector space $2^K$ onto points in the vector space $q^M$. The mapping is not onto, i.e., not all configurations of cell states are used ($2^K < q^M$). The decoder block (e.g. decoder block 16 of FIG. 1) collectively decodes the M read cell states and determines the most probable legitimate configuration of cell states that was stored in the flash memory, which is then used for recovering the K stored information bits. It is well known from information theory and coding theory (R. Gallagher, *Information Theory and Reliable Communication*, Wiley, New York N.Y. USA, 1971) that increasing the dimensionality of the space of possible cell state configurations to which a block of information bits is mapped allows for more efficient storage of information. This way, if a good mapping function or ECC is used, more information bits can be mapped across a given number of flash cells, while the probability of the flash memory to make a transition from one legitimate configuration of states to another is kept arbitrarily small. However, it is not sufficient that the mapping function provide for a high IBPC. The mapping function should also allow low complexity implementation of the encoder and decoder blocks. Coding theory (S. Lin and D. J. Costello, *Error Control Coding:*

*Fundamentals and Applications*, Prentice Hall, Englewood Cliffs N.J. USA, 1983) provides a theoretical basis for designing such good ECCs.

In the example provided in Ban '931, a direct mapping function is used for mapping information bits into configurations of cell states. This method incurs high encoder complexity. A more common low complexity approach, shown in FIG. 2, is to divide encoder block 14 into two parts: 1) a binary ECC encoder block 20 that maps K information bits into N coded bits by adding N-K redundant bits and 2) a simple mapper block 22 that implements a one-dimensional bijective mapping function that maps the N coded bits into M cells by mapping each N/M bits into one of the $q=2^{N/M}$ states of a cell.

Decoder block 16 is also divided similarly into two parts: 1) a simple demapper block 24 that implements a one-dimensional bijective mapping function that maps the M read cell states into N bits by mapping each read cell state into N/M bits, and 2) an ECC decoder block 26 that decodes the N "noisy" bits received from demapper 24 and produces an estimation of the K information bits. An optimal decoder 26 returns the most probable K information bits given the N "noisy" bits.

SUMMARY OF THE INVENTION

A flash controller of the present invention uses a combination of an ECC and a low dimensional non-bijective mapping, providing a low complexity solution for achieving an optimal tradeoff among flash cost, reliability and performance. Moreover a flash controller of the present invention provides very high flexibility in the design of a flash system, supporting any number of states or voltage levels in a flash cell, not necessarily a power of 2. The combination of an ECC and a non-bijective mapper allows for designing a low-complexity optimal solution for a given MBPC flash technology and given performance, cost and/or reliability requirements. More specifically, For a given Flash reliability, a flash controller of the present invention provides lower flash cost and/or higher flash performance, compared to prior art controllers.

For a given flash cost, a flash controller of the present invention provides better flash reliability and/or higher flash performance, compared to prior art controllers.

For a given flash performance, a flash controller of the present invention provides lower flash cost and/or better flash reliability, compared to prior art controllers.

A controller of the present invention uses a non-bijective mapper, i.e. a mapper whose mapping is either not one-to-one, or not onto, or neither one-to-one nor onto. Moreover, the mapping is low dimensional but not necessarily one dimensional, i.e. the mapping can be performed to several cells and not necessarily to only a single cell. The non-bijective mapping allows for using a number of voltage levels in a cell that is not a power of 2. The non-bijective mapping also allows for inducing unequal probabilities over the programmed states or voltage levels of a cell. The added degrees of freedom can be used to optimize the flash memory device's characteristics.

Let $f$ denote the non-bijective mapping function used according to the present invention. $f$ is a mapping from length k binary sequences into length m q-ary sequences, i.e. $f$: $2^k \rightarrow q^m$. Because $f$ is non-bijective, $2^k \neq q^m$. Thus if $f$ is not one-to-one (but is onto) then $2^k > q^m$ and if $f$ is not onto (but is one-to-one) then $2^k < q^m$. We refer herein to a length m q-ary sequence as a configuration. A configuration is stored or programmed into m cells with q states. We refer herein to the configurations that are mapped by $f$ as legitimate configurations.

In the discussion below we need to use a measure of the probability of an undesired transition from one state to another. In flash memory cells it is typically the case that the closer together the threshold voltage ranges of two states are, the higher the probability of transition between the two states. Therefore the term "adjacent states" is used herein to refer to states that are adjacent on the threshold voltage axis. In other words, two states are adjacent to each other if and only if there is no other state of the cell whose threshold voltage falls between the threshold voltages of those two states. This definition also implies that we take adjacency to be a reflexive relation—if $S_1$ is adjacent to $S_2$ then $S_2$ is adjacent to $S_1$.

Note—in the above discussion we are assuming the flash memory cells are of the "conducting floating gate" type, where all the states of a cell differ only in their threshold voltage level. There are flash memory technologies that use a non-conducting floating gate—examples are NROM memories from Saifun Semiconductors of Netanyah, Israel and MirrorBit memories from Spansion. Inc. of Sunnyvale Calif. USA. In such flash memories a cell's states correspond to a combination of multiple (typically two) values of threshold voltages, caused by electric charges residing in multiple places in the gate, that together represent the cell's state. For the purpose of the present invention such flash cells are considered as separate multiple cells, with each electric charge defining a separate threshold voltage with its own concept of "adjacent states". So for example an NROM cell having two electric charges in two opposite edges of the gate, each of the charges capable of being put into four different states (thus supporting the storage of 4 bits in a cell), is considered for the purpose of the current invention to be equivalent to two cells each capable of storing two bits.

We say that two configurations $Q_1$ and $Q_2$ are adjacent configurations if the two configurations differ only in the state of a single cell and the two different states is of the cell are adjacent. In other words, the two configurations are adjacent if the two configurations differ only in the state of the i'th cell such that in one configuration the state of the i'th cell is $S_1$ and in the other configuration the state of the i'th cell is $S_2$ and the state $S_2$ is adjacent to state $S_1$.

We say that a one-to-one mapping $f$ is a generalized Gray mapping if for any two legitimate adjacent configurations $Q_1$ and $Q_2$ the binary sequences $f^{-1}(Q_1)$ and $f^{-1}(Q_2)$ differ only in a single bit.

In some embodiments of the present invention it is desirable to use a generalized Gray mapping in the controller because a generalized Gray mapping minimizes the bit error rate. Probable transitions in the states of cells in the flash memory result in a small number of erroneous bits which can be corrected by an ECC with high probability.

According to one embodiment of the present invention the controller employs a mapping that is not one-to-one. It is desirable to use a mapping that minimizes the expected bit error rate. By combining this non-bijective mapping with an appropriate ECC one can optimize the flash device's cost vs. reliability vs. performance tradeoff.

According to another embodiment of the present invention the controller employs a generalized Gray mapping that is not onto. By combining this non-bijective mapping with an appropriate ECC one can optimize the flash memory device's cost vs. reliability vs. performance tradeoff.

According to yet another embodiment of the present invention, the controller employs a mapping that is neither one-to-one nor onto. By combining this non-bijective mapping with an appropriate ECC, one can optimize the flash memory device's cost vs. reliability vs. performance tradeoff.

Prior art controllers use a one-dimensional bijective mapper, i.e. a mapper that uses a one-to-one mapping of binary sequences into all possible voltage levels of a single cell. Thus, a prior art controller can only use a number of programming voltage levels that is a power of 2. Furthermore, a prior art controller employs equal probabilities over the cell voltage levels when random data are written to the flash memory. In other words, assuming each information bit written to the flash memory has equal probability to be 0 or 1, the probability of programming every voltage level in a flash cell by the flash controller is equally likely.

Unlike the prior art controller, a controller of the present invention uses a non-bijective mapper, i.e. a mapper whose mapping is either not one-to-one, or not onto, or neither one-to-one nor onto. Moreover, the mapping is low dimensional but not necessarily one-dimensional, i.e. mapping can be performed to several cells and not necessarily to only a single cell. The non-bijective mapping allows for using a number of voltage levels in a cell that is not a power of 2. The non-bijective mapping also allows for inducing unequal probabilities over the programmed states or voltage levels of a cell. These added degrees of freedom can be used to optimize the flash memory device's characteristics.

A mapping that is not onto is also used in Park '550. However the mapping used in Park '550 is not a generalized Gray mapping.

Therefore, according to the present invention there is provided a method of storing a plurality of input bits, including the steps of: (a) mapping the input bits to a corresponding programmed state of a memory cell, using a many-to-one mapping; and (b) programming the memory cell to the corresponding programmed state.

Furthermore, according to the present invention there is provided a method of storing a plurality of input bits, including the steps of: (a) mapping the input bits to a corresponding programmed state of a plurality of memory cells, using a many-to-one mapping; and (b) programming the memory cells to the corresponding programmed state.

Furthermore, according to the present invention there is provided a method of storing a plurality of input bits, including the steps of: (a) mapping the input bits to a corresponding programmed state of at least one memory cell, using a mapping that is: (i) into, and (ii) a generalized Gray mapping; and (b) programming the at least one memory cell to the corresponding programmed state.

Furthermore, according to the present invention there is provided a memory device including: (a) a cell; and (b) a controller operative to store a plurality of bits in the cell by: (i) mapping the bits to a corresponding programmed state of the cell, using a many-to-one mapping, and (ii) programming the cell to the corresponding programmed state.

Furthermore, according to the present invention there is provided a system for storing a plurality of bits, including: (a) a memory device that includes a cell; and (b) a processor operative: (i) to map the bits to a corresponding programmed state of the cell, using a many-to-one mapping, and (ii) to program the cell to the corresponding programmed state.

Furthermore, according to the present invention there is provided a memory device including: (a) a plurality of cells; and (b) a controller operative to store a plurality of bits in the cells by: (i) mapping the bits to a corresponding programmed state of the cells, using a many-to-one mapping, and (ii) programming the cells to the corresponding programmed state.

Furthermore, according to the present invention there is provided a system for storing a plurality of bits, including: (a) a memory device that includes a plurality of cells; and (b) a processor operative: (i) to map the bits to a corresponding programmed state of the cells, using a many-to-one mapping, and (ii) to program the cells to the corresponding programmed state.

Furthermore, according to the present invention there is provided a memory device including: (a) at least one cell; and (b) a controller operative to store a plurality of bits in the at least one cell by: (i) mapping the bits to a corresponding programmed state of the at least one cell, using a mapping that is: (A) into, and (B) a generalized Gray mapping, and (ii) programming the at least one cell to the corresponding programmed state.

Furthermore, according to the present invention there is provided a system for storing a plurality of bits, including: (a) a memory device that includes at least one cell; and (b) a processor operative: (i) to map the bits to a corresponding programmed state of the at least one cell, using a mapping that is: (A) into, and (B) a generalized Gray mapping, and (ii) to program the at least one cell to the corresponding programmed state.

Furthermore, according to the present invention there is provided a method of storing N>1 bits, including the steps of: (a) configuring a memory device that includes a memory cell to selectively place the memory cell into $M<2^N$ programmed states; (b) selecting one of the programmed states to represent the bits; and (c) programming the memory cell to the selected programmed state.

Furthermore, according to the present invention there is provided a method of storing N>1 bits, including the steps of: (a) configuring a memory device that includes a plurality of memory cells to selectively place the memory cells into $M<2^N$ programmed states; (b) selecting one of the programmed states to represent the bits; and (c) programming the memory cells to the selected programmed state.

Furthermore, according to the present invention there is provided a method of storing two pluralities of bits, each plurality of bits representing a different respective binary integer, the method including the steps of: (a) mapping each plurality of bits into a corresponding programmed state of a respective memory cell; and (b) programming each respective memory cell to the corresponding programmed state; wherein the programmed states are identical.

Furthermore, according to the present invention there is provided a method of storing two pluralities of bits, each plurality of bits representing a different respective binary integer, the method including the steps of: (a) mapping each plurality of bits into a corresponding programmed state of a respective plurality of memory cells; and (b) programming each respective plurality of memory cells to the corresponding programmed state; wherein the programmed states are identical.

Furthermore, according to the present invention there is provided a method of storing N>1 bits, including the steps of: (a) configuring a memory device that includes at least one memory cell to selectively place the at least one memory cell into $M>2^N$ programmed states; (b) selecting one of the programmed states to represent the bits according to a generalized Gray mapping; and (c) programming the at least one memory cell to the selected programmed state; wherein at least one of the programmed states is excluded from the selecting.

Furthermore, according to the present invention there is provided a memory device, for storing N>1 bits, including: (a) a cell; and (b) a controller operative: (i) to selectively place the cell into $M<2^N$ programmed states, and (ii) to store the bits in the cell by: (A) selecting one of the programmed states to represent the bits, and (B) programming the cell to the selected programmed state.

Furthermore, according to the present invention there is provided a system for storing N>1 bits, including: (a) a memory device that includes a cell; and (b) a processor operative: (i) to selectively place the cell into $M<2^N$ programmed states, and (ii) to store the bits in the cell by: (A) selecting one of the programmed states to represent the bits, and (B) programming the cell to the selected programmed state.

Furthermore, according to the present invention there is provided a memory device, for storing N>1 bits, including: (a) a plurality of cells; and (b) a controller to operative: (i) to selectively place the cells into $M<2^N$ programmed states, and (ii) to store the bits in the cells by: (A) selecting one of the programmed states to represent the bits, and (B) programming the cells to the selected programmed state.

Furthermore, according to the present invention there is provided a system for storing N>1 bits, including: (a) a memory device that includes a plurality of cells; and (b) a processor operative: (i) to selectively place the cells into $M<2^N$ programmed states, and (ii) to store the bits in the cells by: (A) selecting one of the programmed states to represent the bits, and (B) programming the cells to the selected programmed state.

Furthermore, according to the present invention there is provided a memory device including: (a) two cells; and (b) a controller operative to store two pluralities of bits by: (i) mapping each plurality of bits into a corresponding programmed state of a respective one of the cells, and (ii) programming each respective cell to the corresponding programmed state; wherein each plurality of bits represents a different respective binary integer; and wherein the programmed states are identical.

Furthermore, according to the present invention there is provided a system for storing two pluralities of bits, each plurality of bits representing a different respective binary integer, the system including: (a) a memory device that includes two cells; and (b) a processor operative: (i) to map each plurality of bits into a corresponding programmed state of a respective one of the cells, and (ii) to program, each respective cell to the corresponding programmed state; wherein the programmed states are identical.

Furthermore, according to the present invention there is provided a memory device including: (a) two pluralities of cells; and (b) a controller operative to store two pluralities of bits by: (i) mapping each plurality of bits into a corresponding programmed state of a respective one of the pluralities of cells, and (ii) programming each respective plurality of cells to the corresponding programmed state; wherein each plurality of bits represents a different respective binary integer; and wherein the programmed states are identical.

Furthermore, according to the present invention there is provided a system for storing two pluralities of bits, each plurality of bits representing a different respective binary integer, the system including: (a) a memory device that includes two pluralities of cells; and (b) a processor operative: (i) to map each plurality of bits into a corresponding programmed state of a respective one of the pluralities of cells, and (ii) to program each respective plurality of cells to the corresponding programmed state; wherein the programmed states are identical.

Furthermore, according to the present invention there is provided a memory device, for storing N>1 bits, including: (a) at least one cell; and (b) a controller operative: (i) to selectively place at least one the cell into $M>2^N$ programmed states, (ii) to select one of the programmed states to represent the bits according to a generalized Gray mapping, and (iii) to program the at least one cell to the selected programming state; wherein at least one of the programmed state is excluded from the selecting.

Furthermore, according to the present invention there is provided a system for storing N>1 bits, including: (a) a memory device that includes at least one cell; and (b) a processor operative: (i) to selectively place at least one the cell into $M>2^N$ programmed states, (ii) to select one of the programmed states to represent the bits according to a generalized Gray mapping, and (iii) to program the at least one cell to the selected programming state; wherein at least one of the programmed state is excluded from the selecting.

Furthermore, according to the present invention there is provided a computer-readable storage medium having computer-readable code embodied in the computer-readable storage medium, the computer-readable code for storing a plurality of input bits, the computer-readable code including: (a) program code for mapping the input bits to a corresponding programmed state of a memory cell, using a many-to-one mapping; and (b) program code for programming the memory cell to the corresponding programmed state.

Furthermore, according to the present invention there is provided a computer-readable storage medium having computer-readable code embodied in the computer-readable storage medium, the computer-readable code for storing a plurality of input bits, the computer-readable code including: (a) program code for mapping the input bits to a corresponding programmed state of a plurality of memory cells, using a many-to-one mapping; and (b) program code for programming the memory cells to the corresponding programmed state.

Furthermore, according to the present invention there is provided a computer-readable storage medium having computer-readable code embodied in the computer-readable storage medium, the computer-readable code for storing a plurality of input bits, the computer-readable code including: (a) program code for mapping the input bits to a corresponding programmed state of at least one memory cell, using a mapping that is: (i) into, and (ii) a generalized Gray mapping; and (b) program code for programming the at least one memory cell to the corresponding programmed state.

Furthermore, according to the present invention there is provided a computer-readable storage medium having computer-readable code embodied in the computer readable storage medium, the computer-readable code for storing N>1 bits in a memory device that includes a memory cell and that is configured to selectively place the memory cell into $M>2^N$ programmed states, the computer-readable code including: (a) program code for selecting one of the programmed states to represent the bits; and (b) program code for programming the memory cell to the selected programmed state.

Furthermore, according to the present invention there is provided a computer-readable storage medium having computer-readable code embodied in the computer-readable storage medium, the computer-readable code for storing N>1 bits in a memory device that includes a plurality of memory cells and that is configured to selectively place the memory cells into $M>2^N$ programmed states, the computer-readable code including: (a) program code for selecting one of the programmed states to represent the bits; and (b) program code for programming the memory cells to the selected programmed state.

Furthermore, according to the present invention there is provided a computer-readable storage medium having computer-readable code embodied in the computer-readable storage medium, the computer-readable code for storing two pluralities of bits, each plurality of bits representing a different respective binary number, the computer-readable code including: (a) program code for mapping each plurality of bits into a corresponding programmed state of a respective memory cell; and (b) program code for programming each respective memory cell to the corresponding programmed state; wherein the programmed states are identical.

Furthermore, according to the present invention there is provided a computer-readable storage medium having computer-readable code embodied in the computer-readable storage medium, the computer-readable code for storing two pluralities of bits, each plurality of bits representing a different respective binary number, the computer-readable code including: (a) program code for mapping each plurality of bits into a corresponding programmed state of a respective plurality of memory cells; and (b) program code for programming each respective plurality of memory cells to the corresponding programmed state; wherein the programmed states are identical.

Furthermore, according to the present invention there is provided a computer-readable storage medium having computer-readable code embodied in the computer-readable storage medium, the computer-readable code for storing N>1 bits in a memory device that includes at least one memory cell and that is configured to selectively place the at least one memory cell into $M > 2^N$ programmed states, the computer-readable code including: (a) program code for selecting one of the programmed states to represent the bits according to a generalized Gray mapping; and (b) program code for programming the at least one memory cell to the selected programmed state; wherein at least one of the programmed states is excluded from the selecting.

A first basic method of the present invention is a method of storing a plurality of input bits. A many-to-one mapping is used to map the input bits to a corresponding programmed state of a memory cell. Then the memory cell is programmed to that corresponding programmed state. For historical reasons, writing data to a flash memory cell is called "programming" the cell. Because the primary intended application of the present invention is to flash memories, the term "programming" one or more cells is used herein to mean writing data to the cells, even though the scope of the present invention includes memories generally, not just flash memories.

Preferably, the mapping is effected by steps including encoding the input bits as one or more codewords and then mapping the codewords to the corresponding programmed state of the memory cell. The encoding may be either systematic or nonsystematic.

Preferably, the memory cell is a flash memory cell and the programmed state is a threshold voltage state of the cell, i.e., the cell is programmed by setting the threshold voltage of the cell to be in one of a set of threshold voltage ranges defined for the cell.

Preferably, the method also includes reading the memory cell, thereby obtaining a read state value, and then transforming the read state value into a plurality of output bits. Note that the read state value is not necessarily the same as the value of the programmed state. One most preferred method of transforming the read state value into the output bits includes maximum likelihood decoding. Another most preferred method of transforming the read state value into the output bits includes mapping the read state value into a plurality of soft bit estimates and then decoding the soft bit estimates.

Alternatively, the mapping includes encoding the input bits as a plurality of input codewords. The subsequent transforming of the read state value into the output bits includes mapping the read state values into a plurality of output codewords, with each output codeword corresponding uniquely to one of the input codewords. In other words, there is a 1:1 correspondence between input codewords and output codewords. Then, the output words are decoded successively, with the decoding of each output codeword subsequent to the first output codeword being based at least in part on the results of decoding at least one preceding codeword. An example of this most preferred embodiment is described below in Annex E.

A second basic method of the present invention is a method of storing a plurality of input bits. A many-to-one mapping is used to map the input bits to a corresponding programmed state of a plurality of memory cells. Note that this programmed state is a collective state of the cells considered together. Then the memory cells are programmed to that corresponding programmed state.

Preferably, the mapping is effected by steps including encoding the input bits as one or more codewords and then mapping the codewords to the corresponding programmed state of the memory cells. The encoding may be either systematic or nonsystematic.

Preferably, the memory cells are flash memory cells and the programmed state is a threshold voltage state of the cells, i.e., the cells are programmed by setting the threshold voltages of the cells to be in one of a set of collective threshold voltage ranges defined for the cells.

Preferably, the method also includes reading the memory cells, thereby obtaining a read state value, and then transforming the read state value into a plurality of output bits. One most preferred method of transforming the read state value into the output bits includes maximum likelihood decoding. Another most preferred method of transforming the read state value into the output bits includes mapping the read state value into a plurality of soft bit estimates and then decoding the soft bit estimates.

Alternatively, the mapping includes encoding the input bits as a plurality of input codewords. The subsequent transforming of the read state value into the output bits includes mapping the read state values into a plurality of output codewords, with each output codeword corresponding uniquely to one of the input codewords. In other words, there is a 1:1 correspondence between input codewords and output codewords. Then, the output words are decoded successively, with the decoding of each output codeword subsequent to the first output codeword being based at least in part on the results of decoding at least one preceding codeword. An example of this most preferred embodiment is described below in Annex E.

A third basic method of the present invention is a method of storing a plurality of input bits. The input bits are mapped into a corresponding programmed state of one or more memory cells (preferably more than one memory cell), using a mapping that is both into and a generalized Gray mapping. That the mapping is "into" means that the mapping is one-to-one but one or more of the possible programmed states are left out of the mapping. Then the memory cell(s) is/are programmed to that corresponding programmed state.

Preferably, the memory cell(s) is/are (a) flash memory cell(s) and the programmed state is a threshold voltage state of the cell(s).

Preferably, the method also includes reading the memory cells, thereby obtaining a read state value, and then transforming the read state value into a plurality of output bits. One most preferred method of transforming the read state value into the output bits includes maximum likelihood decoding. Another most preferred method of transforming the read state value into the output bits includes mapping the read state value into a plurality of soft bit estimates and then decoding the soft bit estimates.

Alternatively, the mapping includes encoding the input bits as a plurality of input codewords. The subsequent transforming of the read state value into the output bits includes mapping the read state values into a plurality of output codewords, with each output codeword corresponding uniquely to one of the input codewords. In other words, there is a 1:1 correspondence between input codewords and output codewords. Then, the output words are decoded successively, with the decoding of each output codeword subsequent to the first output codeword being based at least in part on the results of decoding at least one preceding codeword. An example of this most preferred embodiment is described below in Annex E.

A fourth method of the present invention is a method of storing N>1 bits. A memory device that includes a memory cell is configured to selectively place the memory cell into it $M>2^N$ programmed states. One of the programmed states is selected to represent the bits, and the memory cell is programmed to the selected programmed state.

A fifth method of the present invention is a method of storing N>1 bits. A memory device that includes a plurality of memory cells is configured to selectively place the memory cells into $M<2^N$ programmed states. One of the programmed states is selected to represent the bits, and the memory cells are programmed to the selected programmed state.

A sixth method of the present invention is a method of storing two pluralities of bits that represent two different respective binary integers. Each plurality of bits is mapped into a corresponding programmed state of a respective memory cell and each respective memory cell is programmed to the corresponding programmed state. The two programmed states are identical. For example, in Table 2 below, both the bit plurality 11 that is a binary representation of the integer 3 and the bit plurality 10 that is a binary representation of the integer 2 are mapped into voltage level 2.

A seventh method of the present invention is a method of storing two pluralities of bits that represent two different respective binary integers. Each plurality of bits is mapped into a corresponding programmed state of a respective plurality of memory cells and each respective plurality of memory cells is programmed to the corresponding programmed state. The two programmed states are identical.

An eighth method of the present invention is a method of storing N>1 bits. A memory device that includes one or more memory cells is configured to selectively place the memory cell(s) into $M>2^N$ programmed states. One of the programmed states is selected to represent the bits according to a generalized Gray mapping. The cell(s) is/are programmed to the selected programmed state. At least one of the programmed state is excluded from the selecting. For example, in Table 6 below, the "1, 1" voltage level is excluded from the selecting.

The scope of the present invention also includes memory devices and systems for implementing the methods. Note that in the memory devices and systems for implementing the sixth and seventh methods, if the two pluralities of bits are stored sequentially, the same cell (sixth method) or the same plurality of cells (seventh method) can be used to store both pluralities of bits. If the two pluralities of bits are stored simultaneously, then the two cells (sixth method) or the two pluralities of cells (seventh method) must be different.

The scope of the present invention also includes computer-readable storage media having embodied thereon computer-readable code for implementing the methods of the present invention.

BRIEF DESCRIPTION OF THE DRAWINGS

The invention is herein described, by way of example only, with reference to the accompanying drawings, wherein.

DESCRIPTION OF THE PREFERRED EMBODIMENTS

Figure 1:
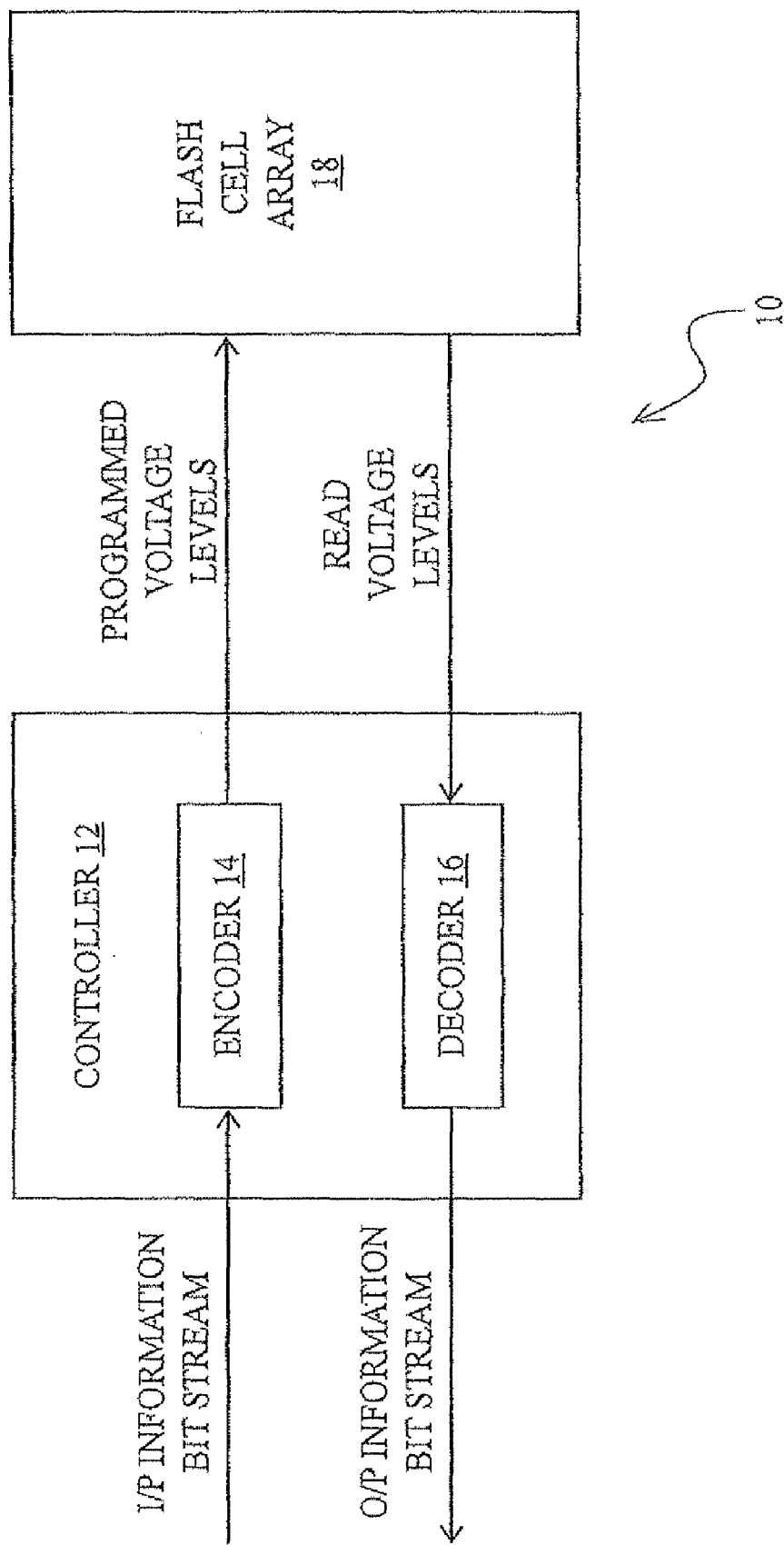
FIG. 1 is a simplified block diagram of a prior art MBPC flash memory device.
Figure 2:
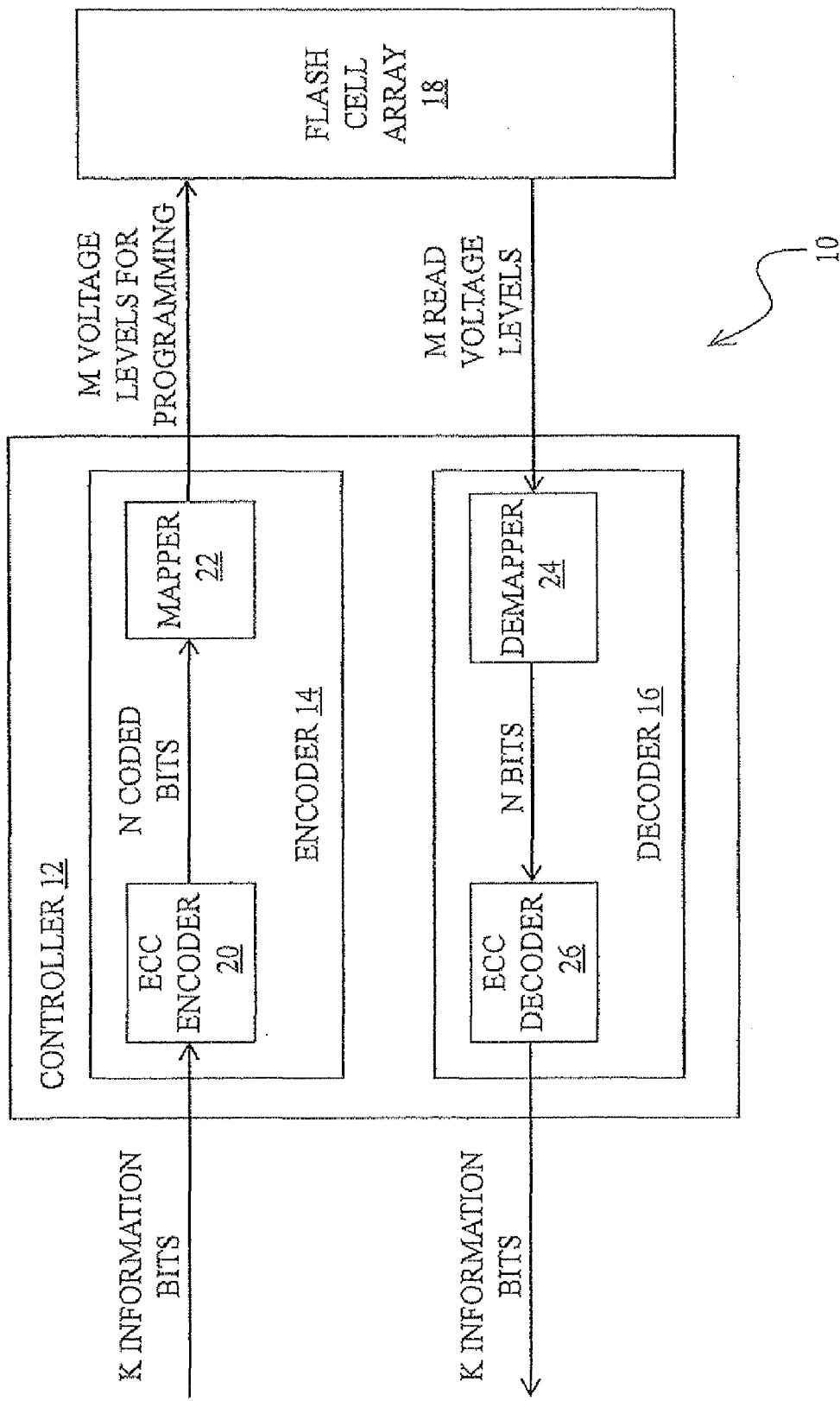
FIG. 2 is a simplified block diagram of one variant of the prior art MBPC flash memory device of FIG. 1.

The principles and operation of a flash memory controller according to the present invention may be better understood with reference to the drawings and the accompanying description.

For a given flash technology and a given required flash reliability, there is an upper bound on the number of information bits that can be stored in a flash memory of a given size by a given flash controller, i.e. an upper bound on the achievable IBPC of the flash device. We refer herein to this upper bound on the IBPC of a flash device as the flash capacity of the device.

The flash capacity for a given flash reliability can be computed using tools from information theory, if the physical model of the flash technology is known. More specifically, one needs to know the probability of reading each voltage level assuming that a given voltage level was programmed in the cell. The method of computing the capacity of the flash memory is described in Annex A. Moreover, information theory also assures that the flash capacity can be achieved if controller complexity is not limited. This can be done by using random ECCs of increasing length for protecting the Flash data. The complexity of encoding and decoding such codes using the flash controller is extremely high. However, by using practical coding techniques with low encoding and decoding complexity one can approach the flash capacity. For these reasons we use the flash capacity for comparing efficiency and optimality of various flash devices.

Based on information theoretic considerations one can see that for a given flash technology and flash reliability there is an optimal number of voltage programming levels that should be used. Furthermore, there is an optimal probability distribution that should be used over the voltage levels. For this number of voltage levels and probability distribution over the levels, the flash capacity is maximized. Hence, using this number of voltage levels in the flash memory device is desirable, because using this number of voltage levels minimizes the flash cost for the given flash reliability. Usually, the optimal number of voltage levels is not a power of 2 and the optimal distribution over the voltage levels is not uniform.

Alternatively, it can be the case that there exists a minimal number of voltage levels such that using more voltage levels provides only a negligible increase in the flash capacity. In this case using the minimal number of voltage levels provides the best tradeoff between flash cost and reliability to flash performance. In other words using the minimal number of voltage levels maximizes the flash write/read throughput while maintaining the same flash cost and reliability.

For example, consider the following simplified model of a flash memory: Let X denote the programmed voltage level of a flash cell and let Y denote the read voltage level of the flash cell. Assume that the programming and the read voltage levels are identical to each other and constant (not time varying). Assume the flash cell is limited to a voltage window of 1 [Volt]. Furthermore, assume that Y=X+N, where N is an additive white Gaussian noise (modeling the physical processes in the flash cell). The noise N is a random variable normally distributed with expectation µ-0 and a standard deviation of σ=150 [mV]. Under this simplified flash model that is not time varying, there is no meaning to data retention and program/erase cycles, hence we define the flash capacity as an upper bound on the achievable IBPC allowing reliable storage, i.e. negligible bit error rate.

Assuming that the flash controller employs equal probabilities over the programming voltage levels (i.e. that each voltage level in the cell is equally likely to be programmed given that the information written to the Flash is random) then:

Using 2 programming voltage levels results in a flash capacity of 0.9946 information bits per cell (IBPC=0.9946).

Using 3 programming voltage levels results in a flash capacity of 1.2169 information bits per cell (IBPC=1.2169).

Using 4 programming voltage levels results in a flash capacity of 1.1612 information bits per cell (IBPC=1.1612).

Figure 3:
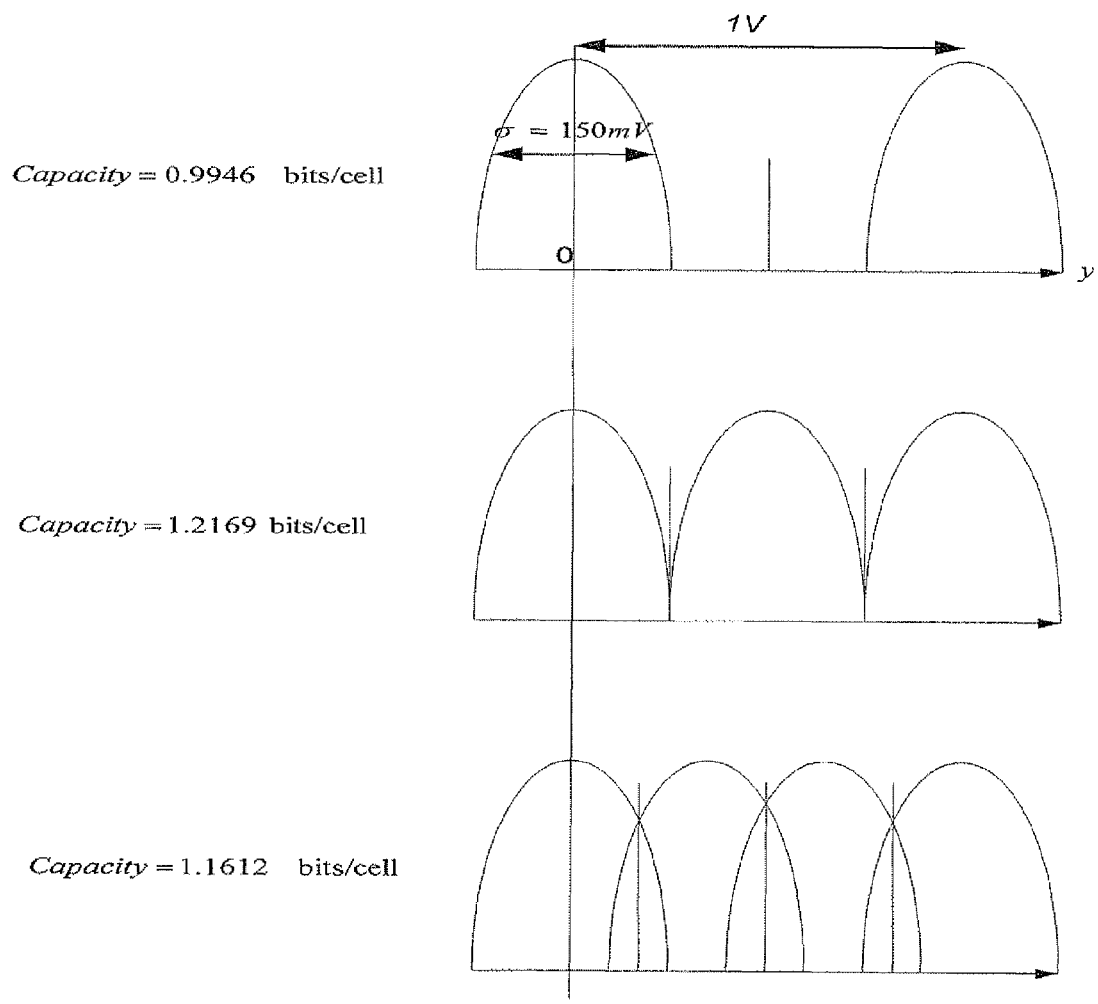
FIG. 3 is a sketch of various threshold voltage distributions, labeled with corresponding capacities.

Returning now to the drawings, FIG. 3 is a sketch of the corresponding threshold voltage distributions. The abscissas in FIG. 3 are threshold voltages. See Annex A for a detailed description of how the capacities of FIG. 3 are computed.

Even higher Flash capacity can be achieved if the controller employs unequal distribution over the voltage levels. The capacity of the flash memory of the simplified model is maximized if 3 programming voltage levels are used and if the middle voltage level is programmed with probability of 28% while the two outer voltage levels are programmed with probability of 36% each. In this case the flash capacity is 1.2245 information bits per cell (IBPC=1.2245). The intuitive explanation for this is that the middle programming voltage level is twice as likely to be read in error (i.e. to be read at a different read level from the programming level) compared to the outer voltage levels. Hence by reducing the programming probability of the middle level we reduce the overall probability of voltage level error. In order to employ the unequal probability over the cell voltage levels the flash controller needs to add some redundant bits. However due to the reduced error probability the controller requires fewer redundant bits in order to allow reliable storage of information in the flash memory. Overall, the total number of redundant bits (the ones used for employing unequal probability and the ones used for protecting the data from errors) is reduced, resulting in higher flash capacity.

In the context of the simplified model, a flash controller of the present invention allows for using 3 voltage levels and can employ the optimal probabilities distribution over the voltage levels. What do we gain compared to the prior art controller which uses 4 voltage levels with equal probability?

1. We gain reduced flash cost: for storing the same amount of information: flash size is reduced by 5.17% ($IBPC_{prior\ art\ controller}/IBPC_{present\ invention}$=1.1612/ 12245=0.9483).

2. We gain improved flash performance: using 3 programming voltage levels instead of 4, resulting in higher read/write flash throughput.

Figure 4:
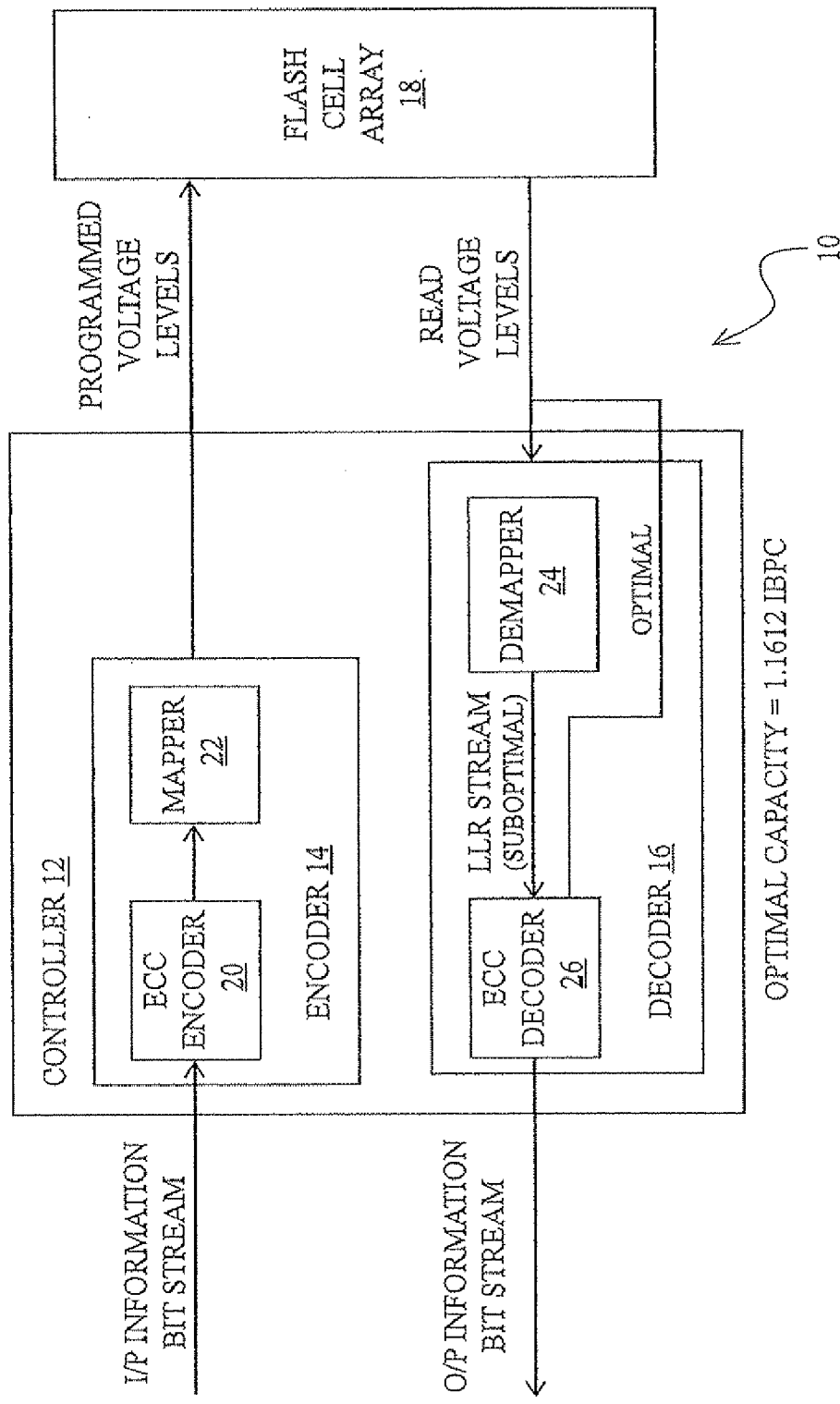
FIG. 4 is FIG. 2 specialized to the third threshold voltage distribution of FIG. 3.

FIG. 4 shows an implementation of prior art flash memory device 10 using 4 equal probability programming voltage levels. Flash controller 12 includes the following blocks:

1. Error Correction Code (ECC) layer:

ECC encoder 20: encodes a stream of information bits into a stream of coded bits. The rate of the ECC is the ratio of the information bits to the coded bits. For example, an ECC based on a binary linear block code maps blocks of K information bits into blocks of N coded bits, where N>K. The ECC rate is R=K/N. In the example shown in FIG. 4 we assume that a binary linear block code is used.

ECC decoder 26: decodes the "noisy" coded bit stream and produces an estimation of the information bits stream. The "noisy" coded bit stream is the original coded bit stream with some of its original symbols (or bits in the case of a binary code) flipped into different symbols. For example a decoder 26 for a binary linear block code receives a "noisy" block of N coded bits (a.k.a "noisy" codeword) and decodes the "noisy" block, producing an estimation of the block of K information bits. Improved correction capability of decoder 26 can be achieved if "soft" estimates of the coded bits are provided to decoder 26 and "soft" decoding is performed. "Soft" decoding can be performed if information on the probabilities of the bits to be erroneous is utilized by decoder 26 in the decoding process. A "soft" estimate of a bit b can be given is various ways. Two common ways are: 1) providing the a-priori probability of the bit b to be 1 given the voltage level/s y read from the flash memory, Pr(b=1|y). 2) providing an a-priori Log Likelihood Ratio (LLR) for the bit b given the voltage level/s y read from the flash memory, LLR=log(Pr(b=0|y)/Pr (b=1|y)). An explanation of how to compute a-priori LLRs is given in Annex C. In the example shown in FIG. 4 we assume a "soft" decoder 26 is used and the flash capacity is computed accordingly.

2. Mapping/Demapping Layer:

Mapper 22: maps a stream of coded bits into a stream of voltage levels that are to be programmed into the flash cells. According to the prior art, mapper 22 employs a bijection mapping function, i.e. a function that is one-to-one (injective) and onto (surjective). See Annex B for the formal definitions of bijective, injective and surjective functions.

Demapper 24: maps a stream of voltage levels read from flash cell array 18 into a stream of bits, or into a stream of "soft" estimates of bits in case a "soft" decoder is used. Actually, demapper 24 is not essential. Various coding schemes can be used, some with a demapper and some which operate directly on the read voltage levels as described below. In the example shown in FIG. 4 we show both schemes: with and without demapper 24.

Table 1 shows the map from bit sequence to voltage level that is used by controller 12 of FIG. 4.

TABLE 1

| Bit Sequence | Voltage Level |
|---|---|
| 0 0 | 0 |
| 0 1 | 1 |
| 1 1 | 2 |
| 1 0 | 3 |

In order to approach the theoretical flash capacity, an optimal coding scheme should be used. Two such coding schemes are:

1. Single-Level Coding (SLC) with optimal. Maximum-Likelihood (ML) decoding: in this scheme the entire information bit stream is encoded by a single code, and decoded using an optimal ML decoder. An ML decoder computes the most likely information bit stream directly from the voltage levels that were read from flash cell array. An optimal decoder usually incurs high decoding complexity. A detailed explanation of the optimal SLC scheme is provided in Annex D. The optimal SLC coding scheme is represented in FIG. 4 as the arrow that bypasses demapper 24.

2. Multi-Level Coding (MLC) with Multi-Stage Decoding (MSD): in this scheme the information bit stream is divided into several streams and each bit stream is encoded using a different code. Decoding is performed in stages, where in each stage a single coded bit stream is decoded using a "soft" decoder that operates on "soft" bit estimates provided by the demapper. The decoding result of each coded bit stream is used by the demapper in order to compute the "soft" bit estimates of the next coded bit stream. A detailed explanation of the optimal MLC/MSD scheme is provided in Annex E.

It is very common to use SLC schemes that are based on suboptimal decoding. The suboptimal decoding does not operate directly on the voltage levels read from the flash cell array, but rather on the "soft" bit estimates provided by the demapper. Because the demapper estimates are based only on first order statistics, some information is lost and decoding is not optimal. However, such schemes require lower implementation complexity and in many cases result only in negligible performance loss as a generalized Gray mapping can be found and used. A detailed explanation of a suboptimal SLC scheme is provided in Annex D. Such a suboptimal SLC scheme is represented in FIG. 4 as the arrows from flash cell array 18 to demapper 24 and from demapper 24 to ECC decoder 26.

We measure the cost of a flash memory device by the capacity of the memory device, i.e. by the achievable flash memory device IBPC. In the example shown in FIG. 4, the capacity of the prior art flash memory device based on an optimal coding scheme is 1.1612 IBPC (See Annex A). In order to approach this Flash capacity a good ECC of rate 1.1612/2=0.5806 should be used.

Figure 5:
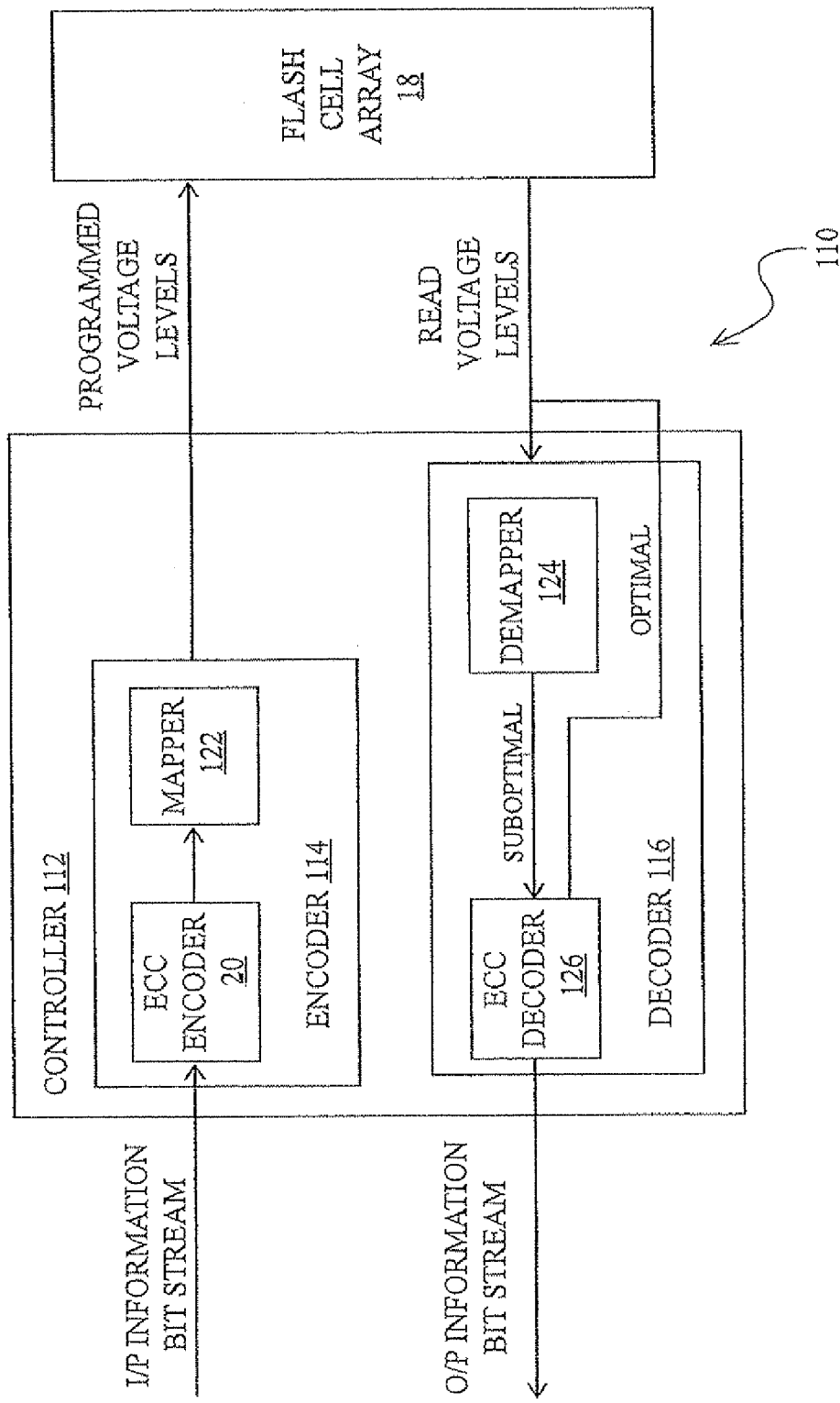
FIG. 5 is a simplified block diagram of a MBPC flash memory device of the present invention.

FIG. 5 is a simplified block diagram of a MBPC flash memory device 110 of the present invention. Specifically, flash memory device 110 is flash memory device of FIG. 4 as modified according to the present invention. Like flash memory device 10, flash memory device 110 includes a flash controller 112, and a flash cell array 18 that is inherited from device 10. Flash controller 112 includes an encoder 114 and a decoder 116. Encoder 114 includes ECC encoder block 20 of device 10 and a mapper block 122 of the present invention. Decoder 116 includes a demapper block 124 of the present invention and a ECC decoder block 126 of the present invention. Unlike prior art mapper block 22, mapper block 122 of the present invention employs a mapping function that is not a bijection function. The mapping function of the present invention is either not one-to-one (infective), in the first embodiment of the present invention discussed below, or not onto (surjective), in the second embodiment of the present invention discussed below. This allows for designing a flash memory device using any arbitrary number of voltage levels (which is not necessarily a power of 2) and any arbitrary probability distribution over the programming voltage levels. This additional freedom in designing the flash memory device 110 allows designing a more efficient flash memory device providing a better tradeoff between flash cost, reliability and performance. Moreover, in the second embodiment of the present invention discussed below, a generalized Gray mapping is used. This reduces the expected bit error rate at the input of ECC decoder 126. It allows for a very simple implementation of controller 112 using a suboptimal SLC coding scheme with negligible loss of efficiency in flash memory device 110, i.e. negligible reduction in the capacity of flash memory device 110. In the first embodiment of the present invention discussed below we also use a mapping that minimizes the expected bit error rate at the input of ECC decoder 126.

Tables 2 and 3 show a mapping function and a soft demapping of an instance of the first embodiment of the present invention in which only three programming levels are used. The mapping function is not one-to-one (not injective). Due to the use of an ECC we can recover the information bits even though the mapping is not one-to-one. For example if a SLC coding scheme with a "soft" demapper and a "soft" decoder is used, as shown in Table 3, then when voltage level 2 is read, demapper 124 provides a-priori estimates of the bits that were mapped to voltage level 2. The first bit is 1 with high probability, represented by $LLR_1=\log(Pr(b_1=0|y)/Pr(b_1=1|y))=-5.3$. For the second bit there are almost equal probabilities to be 1 or 0. Actually it is slightly more likely that the second bit is 1 since if we read voltage level 2 it is slightly more likely that the programmed level was 2 or 1 than it was 2 or 0, that is, $$Pr(\text{program level}=2 \text{ or } 1 | \text{read level}=2) > Pr(\text{program level}=2 \text{ or } 0 | \text{read level}=2)$$

Computing the exact probabilities based on the Flash model we get:

$$LLR_2=\log(Pr(b_2=0|y)/Pr(b_2=1|y))=-0.1.$$

For more details on how LLRs are computed see Annex C. The soft decoder takes into account all these "soft" bit estimates and returns the most probable information bit stream that was stored in flash array 18.

The mapping of Table 2 results in a probability distribution of [0.25 0.25 0.5] over the three programming voltage levels. The capacity of flash memory device 110 using the mapping function of Table 2 and the soft demapping of Table 3 and based on an optimal coding scheme is 1.166 IBPC (See Annex A). In order to approach this flash capacity a good ECC of rate 1.166/2=0.583 should be used. The capacity is quite similar to the capacity of flash memory device 10 of FIG. 4. However, this instance of flash memory device 110 uses only 3 voltage levels compared to 4 voltage levels of prior art flash memory device 10, resulting in higher read/write throughput.

TABLE 2

| Bit Sequence | Voltage Level |
| --- | --- |
| 0 0 | 0 |
| 0 1 | 1 |
| 1 1 | 2 |
| 1 0 | 2 |

TABLE 3

| Voltage Level | LLR Sequence | |
|---|---|---|
| 0 | 20.7 | 4.3 |
| 1 | 3.3 | −3.3 |
| 2 | −5.3 | −0.1 |

Tables 4 and 5 show a mapping function and a soft demapping of another instance of the first embodiment of the present invention in which three programming levels are used. The mapping function is not one-to-one (not injective). This mapping function results in a probability distribution of [0.375 0.25 0.375] over the three programming voltage levels. The capacity of Flash memory device 110 using the mapping function of Table 4 and the soft demapping of Table 5 and based on an optimal coding scheme is 1.2224 IBPC (see Annex A). In order to approach this flash capacity a capacity approaching ECC of rate 1.2224/3=0.4075 should be used. The capacity of flash memory device 110 based on this optimal coding scheme is higher than the capacity of prior art flash memory device 10 of FIG. 4, resulting in lower flash cost by ~5%. Moreover, this instance of flash memory device 110 uses only 3 voltage levels compared to 4 voltage levels of prior art Flash memory device 10, resulting in higher read/write throughput.

TABLE 4

| Bit Sequence | Voltage Level |
|---|---|
| 0 0 0 | 0 |
| 0 0 1 | 0 |
| 0 1 1 | 0 |
| 0 1 0 | 1 |
| 1 1 0 | 1 |
| 1 1 1 | 2 |
| 1 0 1 | 2 |
| 1 0 0 | 2 |

TABLE 5

| Voltage Level | LLR Sequence | | |
|---|---|---|---|
| 0 | 5.9 | 0.9 | −09. |
| 1 | 0 | −3.3 | 3.3 |
| 2 | −5.9 | 0.9 | −0.9 |

Tables 6 and 7 show a mapping function and a soft demapping of the second embodiment of the present invention in which three programming levels are used. Each sequence of 3 coded bits is mapped into 2 programming voltage levels that are programmed into 2 flash cells. Thus, the mapping function of Table 6 is not surjective. The capacity of Flash memory device 110 using the mapping function of Table 6 and the soft demapping of Table 7 and based on optimal coding scheme is 1.1987 IBPC (See Annex A). In order to approach this flash capacity using optimal and suboptimal coding schemes, capacity approaching ECCs of rate 1.1987/(3 bits/2 cells)=0.7991 should be used. The capacity of flash memory device 110 based on this optimal coding scheme is higher than the capacity of prior art flash memory device 10 of FIG. 4, resulting in lower flash cost by ~3.1%. Moreover, this embodiment of flash memory device 110 uses only 3 voltage levels compared to 4 voltage levels of prior art flash memory device 10, resulting in higher read/write throughput.

TABLE 6

| Bit Sequence | Voltage Level |
|---|---|
| 0 0 0 | 0, 0 |
| 0 0 1 | 0, 1 |
| 0 1 1 | 0, 2 |
| 0 1 0 | 1, 2 |
| 1 1 0 | 2, 2 |
| 1 1 1 | 2, 1 |
| 1 0 1 | 2, 0 |
| 1 0 0 | 1, 0 |

TABLE 7

| Voltage Levels | LLR Sequence | | |
|---|---|---|---|
| 0, 0 | 4.4 | 21.7 | 4.4 |
| 0, 1 | 8.7 | 4.2 | −4.2 |
| 0, 2 | 21.7 | −4.4 | −4.4 |
| 1, 0 | −4.2 | 8.7 | 4.2 |
| 1, 1 | 0 | 0 | 0 |
| 1, 2 | 4.2 | −8.7 | 4.2 |
| 2, 0 | −21.7 | 4.4 | −4.4 |
| 2, 1 | −8.7 | −4.2 | −4.2 |
| 2, 2 | −4.4 | −21.7 | 4.4 |

Figure 6:
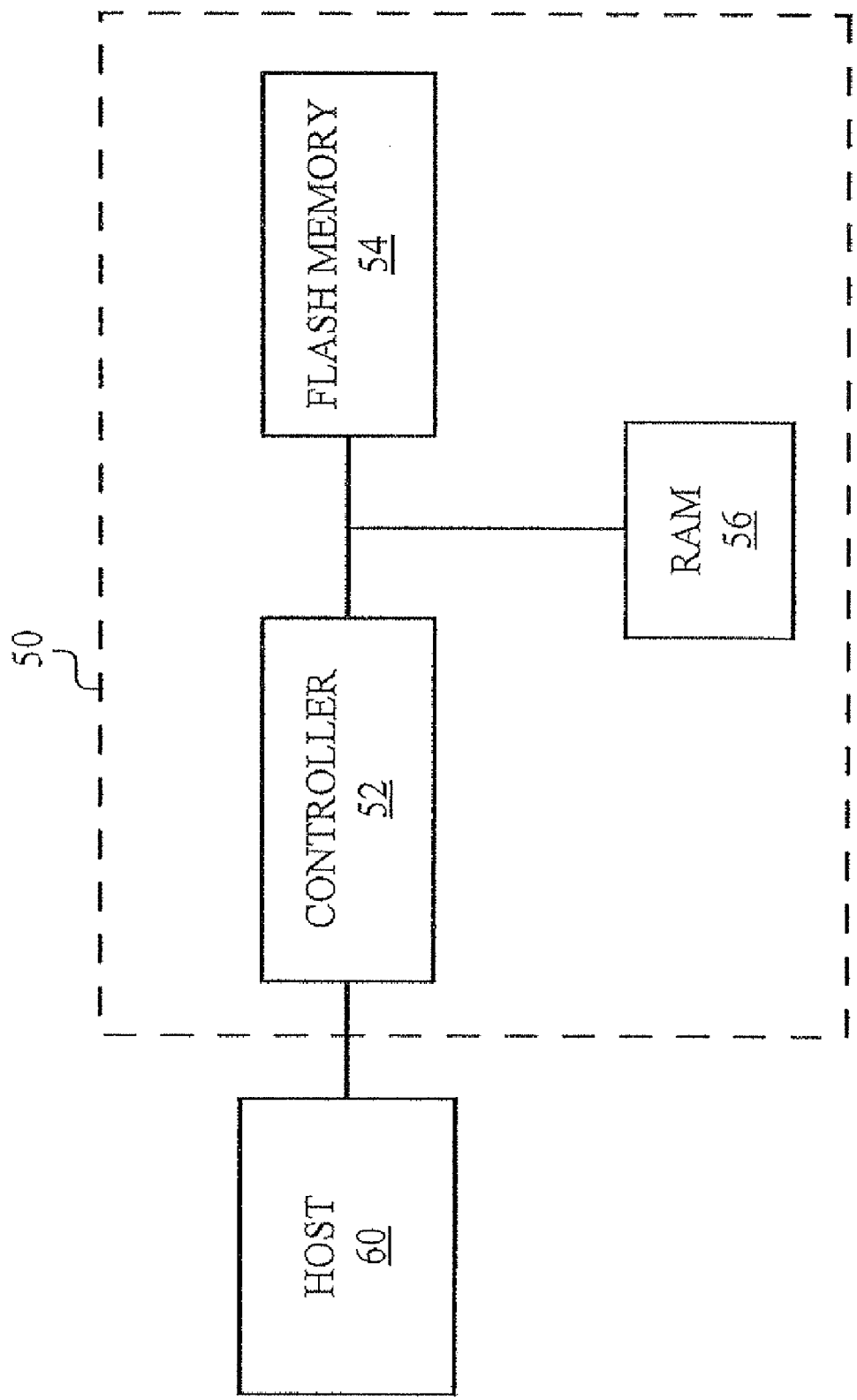
FIG. 6 is a high-level block diagram of a flash memory device of the present invention coupled to a host.

FIG. 6 is a high-level block diagram of a flash memory device 50 of the present invention coupled to a host 60. FIG. 6 is adapted from FIG. 1 of Ban, U.S. Pat. No. 5,404,485, which patent is incorporated by reference for all purposes as if fully set forth herein. Flash memory device 50 includes a flash memory 54, a controller 52 and a random access memory (RAM) 56. Controller 52, that corresponds to "flash control 14" of U.S. Pat. No. 5,404,485, manages flash memory 54, with the help of RAM 56, as described in U.S. Pat. No. 5,404,485. Flash memory 54 encodes data, two or more bits per cell of flash memory 54, as described in U.S. Pat. No. 6,522,580 or in U.S. Pat. No. 6,643,188. Controller 52 also performs ECC encoding and decoding and non-bijective mapping and demapping as described above.

Figure 7:
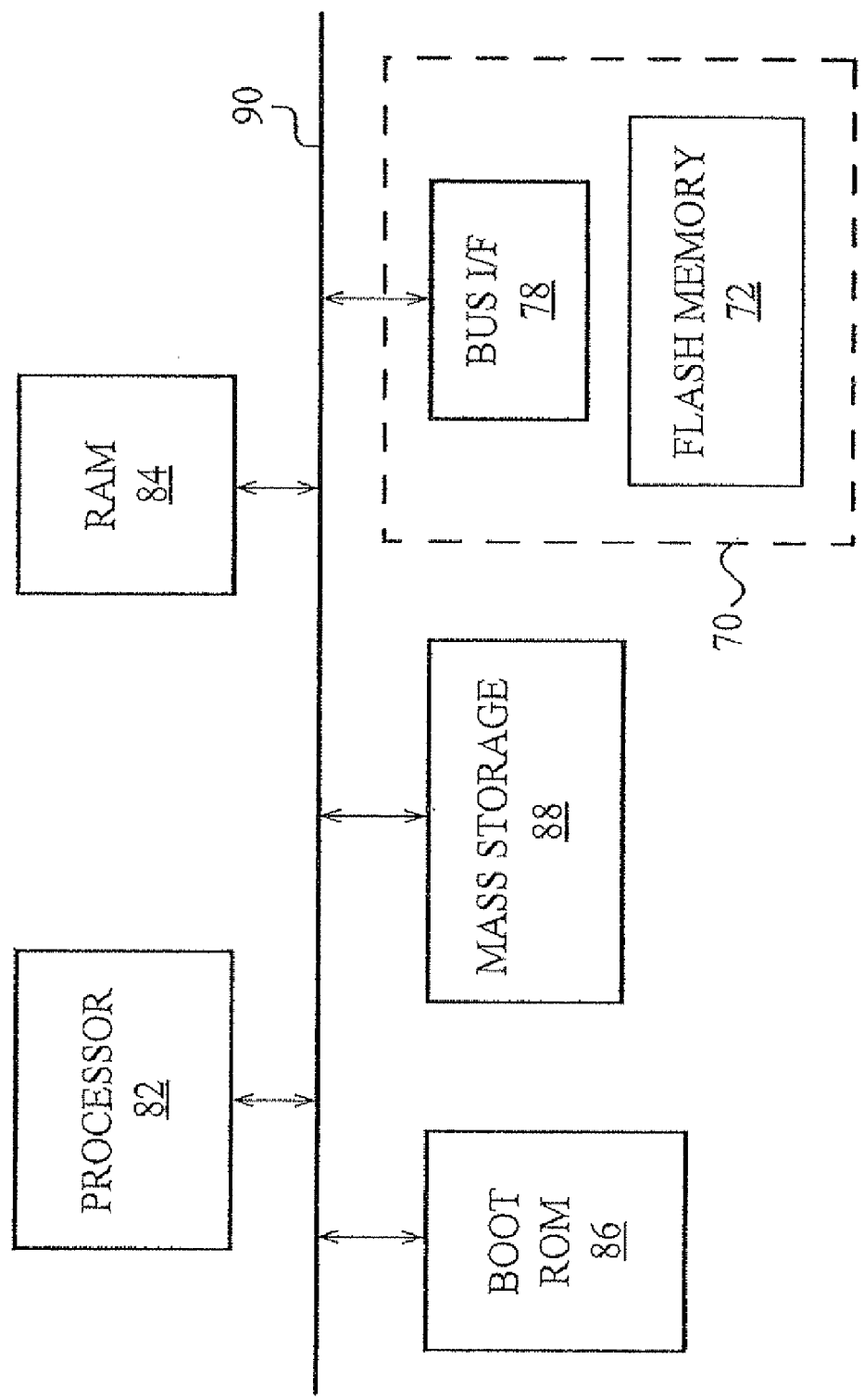
FIG. 7 is a high-level partial block diagram of a data storage system of the present invention

FIG. 7 is a high-level partial block diagram of an alternative data storage system 80 of the present invention. Data storage system 80 includes a processor 82 and four memory devices: a RAM 84, a boot ROM 86, a mass storage device (hard disk) 88 and a flash memory device 70, all communicating via a common bus 90. Like flash memory device 50, flash memory device 70 includes a flash memory 72. Unlike flash memory device 50, flash memory device 70 lacks its own controller and RAM. Instead, processor 82 emulates controller 52 by executing a software driver that implements the methodology of U.S. Pat. No. 5,404,485 in the manner e.g. of the TrueFFS™ driver of msystems Ltd. of Kfar Saba, Israel. Flash memory 72 encodes data, two or more bits per cell of flash memory 72, as described in U.S. Pat. No. 6,522,580 or in U.S. Pat. No. 6,643,188. Processor 82 also performs ECC encoding and decoding and non-bijective mapping and demapping as described above. Flash memory device 70 also includes a bus interface 78 to enable processor 82 to communicate with flash memory 72.

The ECC codes of the present invention may be either "systematic" or "non-systematic". Systematic error correction coding is characterized by the fact that the original data bits are preserved by the encoding process and can be identified within the bits stored. In other words, the error correction mechanism takes the original data bits, adds to them some parity bits, and stores both data bits and parity bits. Later, when reading the stored bits, both the data bits and the parity bits are read, and the parity bits enable the correction of errors in the read data bits, thus generating the original data bits.

In nonsystematic error correction codes the original data bits are not preserved and are not stored. Instead, the encoding process transforms the original data bits into a larger group of bits, sometimes called "protected data bits", that are the ones stored. Like the union of data bits and the associated parity bits of a systematic error code, the protected data bits of a non-systematic error code are considered herein to be the codeword corresponding to the original data bits. When reading the stored protected data bits the original data bits are re-generated, even if there are errors in the protected data bits. The defining characteristic of non-systematic codes is that there is no direct correspondence between a specific original data bit and a specific stored bit. An original data bit is "scattered" in multiple stored bits, and only the combination of those multiple stored bits tells the value of the original bit.

The code of the software driver that processor 82 executes to manage flash memory 72 is stored in mass storage device 88 and is transferred to RAM 84 for execution. Mass storage device 88 thus is an example of a computer-readable code storage medium in which is embedded computer readable code for managing flash memory 72 according to the principles of the present invention.

While the invention has been described with respect to a limited number of embodiments, it will be appreciated that many variations, modifications and other applications of the invention may be made.

Annex A: Flash Capacity Computation

Let X denote the programming voltage level. Let Y denote the read voltage level. Let P(X) denote the probability of programming voltage level X. Let P(Y|X) denote the probability to read voltage level Y given that voltage level X was programmed. Then the flash capacity is given by $$C = \sum_{X,Y} P(X)P(Y\mid X)\log_2\left(\frac{P(Y\mid X)}{\sum_X P(X)P(Y\mid X)}\right)$$

Two examples for computing the capacity of a flash memory are provided next.

Example 1

Computing the Capacity of Flash Memory 10 of FIG. 4

The programming and read voltage levels are: $\underline{X}=\underline{Y}=[0.333\ 0.666\ 1]$ [Volts], The flash memory suffers from an additive Gaussian noise with standard deviation σ=150 [mV], Each programming level is programmed with equal probability:

P($X_i$)=0.25 for i=1, 2, 3, 4

The transition probabilities are computed as follows:

$$P(Y_j\mid X_i) = Q\left(\frac{|Y_j - X_i| - 0.1667}{\sigma}\right) - Q\left(\frac{|Y_j - X_i| + 0.1667}{\sigma}\right)$$
for j = 2, 3

$$P(Y_j\mid X_i) = Q\left(\frac{|Y_j - X_i| - 0.1667}{\sigma}\right)$$ for j = 1, 4

-continued where, $Q(x) = \int_x^\infty \frac{1}{\sqrt{2\pi}} e^{-x^2/2}$

Then the flash capacity is given by:

$$C = \sum_{i=1}^{4}\sum_{j=1}^{4} P(X_i)P(Y_j\mid X_i)\log_2\left(\frac{P(Y_j\mid X_i)}{\sum_{k=1}^{4} P(X_k)P(Y_j\mid X_k)}\right)$$

= 1.1612 IBPC

Example 2

Computing the Capacity of Flash Memory 110 of FIG. 5, Embodiment of Tables 4 and 5

The programming and read voltage levels are: $\underline{X}=\underline{Y}[0\ 0.5\ 1]$[Volts], The flash memory suffers from an additive Gaussian noise with standard deviation σ=150 [mV], The non-bijective mapping induces the following non-uniform distribution over the programming voltage levels:

P($\underline{X}$)=[0.375 0.25 0375]

The transition probabilities are computed as follows:

$$P(Y_j\mid X_i) = Q\left(\frac{|Y_j - X_i| - 0.25}{\sigma}\right) - Q\left(\frac{|Y_j - X_i| + 0.25}{\sigma}\right)$$ for j = 2

$$P(Y_j\mid X_i) = Q\left(\frac{|Y_j - X_i| - 0.25}{\sigma}\right)$$ for j = 1, 3

Then the flash capacity is given by:

$$C = \sum_{i=1}^{3}\sum_{j=1}^{3} P(X_i)P(Y_j\mid X_i)\log_2\left(\frac{P(Y_j\mid X_i)}{\sum_{k=1}^{3} P(X_k)P(Y_j\mid X_k)}\right)$$

= 1.2224 IBPC

Annex B: Formal Function-Related Definitions

Definition (one-to-one): A function ƒ is said to be one-to-one (injective) if and only if ƒ(x)=ƒ(y) implies x=y. Otherwise, the function is many-to-one: there exists at least one argument pair (x,y) such that x≠y and ƒ(x)=ƒ(y).

Definition (onto): A function ƒ from a set A to a set B is said to be onto(surjective) if and only if for every element y of B there is an element x in A such that ƒ(x)=y, that is, ƒ is onto if and only if ƒ(A)=B. Otherwise, the function is into: there is at least one element y of B that is not mapped to by ƒ.

Definition (bijection): A function is called a bijection, if the function is onto and one-to-one.

Annex C: Log-Likelihood Ratio (LLR) Computation

Let ƒ: $2^m \to [1, 2, \ldots, M]$ denote the mapping function, matching each length m binary sequences b to a programmed cell/s state X out of possible states of the cell/s. Furthermore, let Y denote the read cell/s state. Then, the Log-Likelihood Ratio (LLR) for bit i is given by:

$$LLR_i(Y) = \log\left(\frac{Pr(b_i = 0 | Y)}{Pr(b_i = 1 | Y)}\right) = \log\left(\frac{Pr(Y | b_i = 0)}{Pr(Y | b_i = 1)}\right)$$

$$= \log\left(\frac{\sum_{X \in X_i^0} Pr(Y | X)}{\sum_{X \in X_i^1} Pr(Y | X)}\right),$$

where $X_i^0 = \{X \mid \exists \underline{b} \in \underline{b}_i^0 \text{ such that } f(\underline{b}) = X\},$ $X_i^1 = \{X \mid \exists \underline{b} \in \underline{b}_i^1 \text{ such that } f(\underline{b}) = X\}$ and $b_1^0$, $b_1^1$ denote the sets of length m binary sequences with the i'th bit equal to 0 and 1 respectively. The probabilities Pr(Y|X) are computed as described in Annex A. Note that we assume that the bits have equal a-priori probabilities (i.e. a bit has equal probability to be 0 or 1).

Annex D: Coding Scheme Based on Single-Level Coding (SLC)

Reference: U. Wachsmann, R. F. H. Fischer and J. B. Huber, "Multilevel codes: theoretical concepts and practical design rules", *IEEE Transactions on Information Theory* vol. 45 no. 5 pp. 1361-1391 (1999)

In a single level coding scheme an information bit stream $\underline{i}$ is encoded using a single code. The coded bits are mapped to programming voltage levels of the flash memory. The read voltage levels are then decoded in order to recover the original information bit stream. Flash memory 10 of FIG. 4 and flash memory 110 of FIG. 5 use a single level coding scheme.

Let $\underline{i}$ denote the information bit stream stored in the flash memory. Let $\underline{Y}$ denote the sequence of read voltage levels. Furthermore, assume that every information bit stream has equal a-priori probability. Optimal Maximum-Likelihood (ML) decoding is given by:

$$\hat{\underline{i}} = \underset{\underline{i}}{\operatorname{argmax}} Pr(\underline{i} | \underline{Y}) = \underset{\underline{i}}{\operatorname{argmax}} Pr(\underline{Y} | \underline{i}).$$

ML decoding usually incurs very high decoding complexity. Hence, it is very common to use suboptimal decoding algorithms. For example, Low complexity iterative decoding algorithms can perform very close to ML decoding. (Y. Nana, E. Sharon and S. Litsyn, "Improved decoding of LDPC coded modulations", *IEEE Communication Letters* vol. 10 no. 5 pp. 375-377 (2006))

Additional simplification of the decoding scheme can be obtained if the decoder does not operate directly on the read voltage levels but rather on "soft" estimates of the stored bits such as LLRs that are generated by a demapper. This scheme is not optimal because the demapper extracts only first order statistics of the stored bits and ignores statistical dependencies between bits that are mapped to the same cell state. Usually the performance loss is very small if generalized Gray mapping is used. (G. Caine, G. Taricco and E. Biglieri, "Bit interleaved coded modulation". *IEEE Transactions on Information Theory* vol. 44 no. 3 pp. 927-946 (1998)).

Annex E: Coding Scheme Based on Multi-Level Coding (MLC) with Multi-Stage Decoding (MSD)

Reference: U. Wachsmann, R. F. H. Fischer and J. B. Huber, "Multilevel codes: theoretical concepts and practical design rules", *IEEE Transactions on Information Theory* vol. 45 no. 5 pp. 1361-1391 (1999)

In this scheme the information bit stream is divided into m streams and each bit stream is encoded using a different code. The m coded bit streams are then used by the mapper to produce a stream of programming voltage levels. Each m bits, one from each coded bit stream, are mapped to a programming voltage level.

Figure 8:
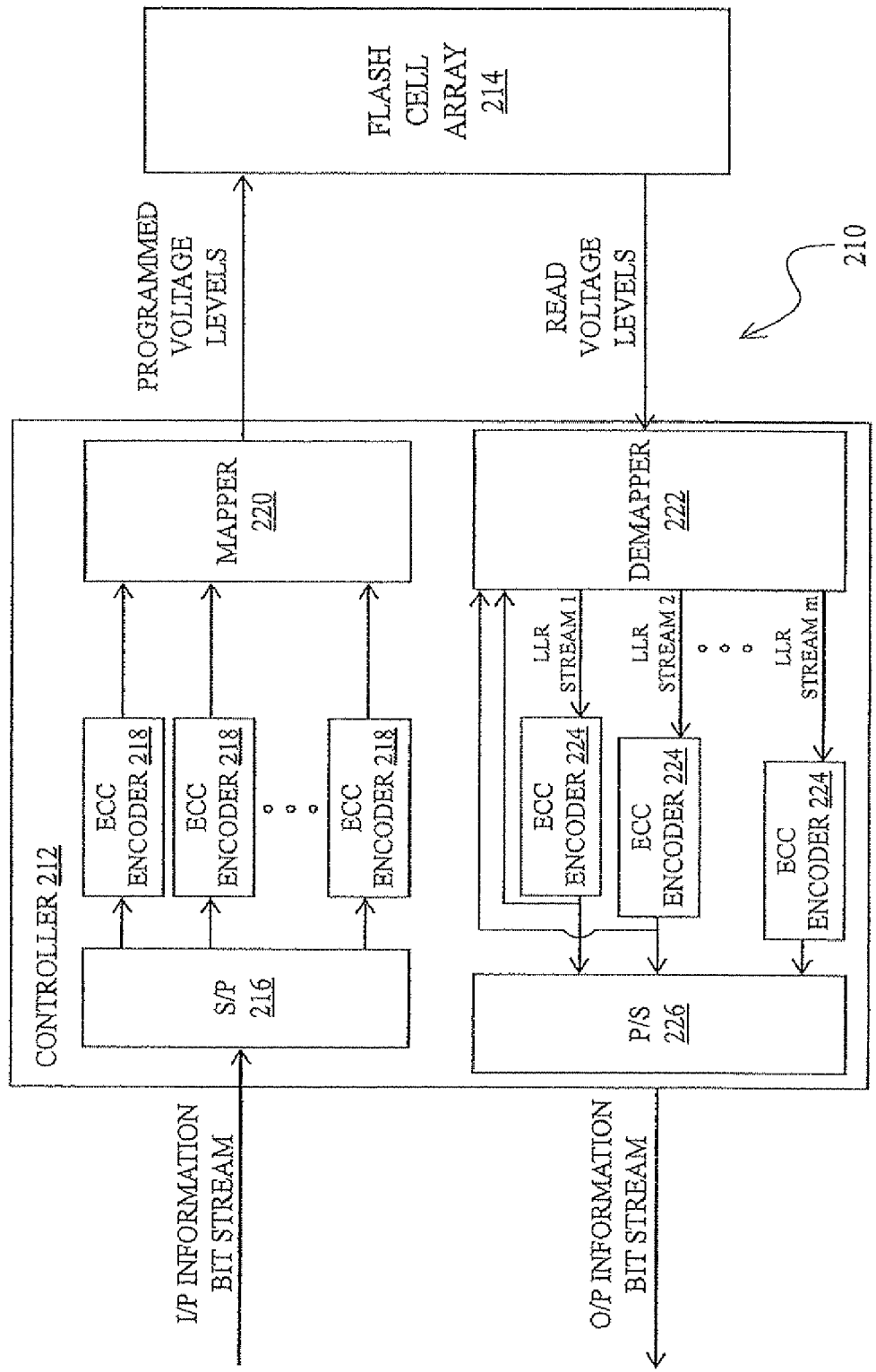
FIG. 8 is a simplified block diagram of a flash memory that uses multi-level coding and multi-stage decoding.

FIG. 8 is a simplified block diagram of a MLC/MSD flash memory 210, either of the prior art or according to the present invention. Flash memory 210 includes a MLC/MSD controller 212, and a flash memory cell array 214 that is identical to flash memory cell array 18 of FIGS. 4 and 5. Controller 212 includes a parallelizer (serial to parallel) 216 that parallelizes the incoming stream of information bits to m internal input bit streams, m ECC encoders 218 that encode respective internal input bit streams, a mapper 220 that maps the encoded bit streams to programmed voltage levels for programming flash cell array 214, a demapper for demapping read voltage levels to m internal output bit streams, m ECC decoders 224 that decode respective internal output bit streams as described below, and a serializer (parallel to serial) 226 that serializes the decoded bit streams.

When flash cell array 214 is read, decoding is performed in order to recover the stored information. Decoding is performed in stages. In each stage a single coded bit stream is decoded using respective "soft" decoder 224 that operates on "soft" bit estimates provided by demapper 222. The decoding result of each coded bit stream (except the m-th bit stream) is fed back to demapper 222 and is used by demapper in order to compute the "soft" bit estimates of the next coded bit strewn, and so on until all m information bit streams are recovered.

The MLC/MSD scheme can use low complexity decoders that operate on the demapper output and not on the read voltage levels directly, while maintaining the optimality of the scheme. However MLC/MSD has several practical disadvantages. For example, MLC/MSD requires good knowledge of the flash memory's physical model in order to design the scheme and MLC/MSD is sensitive to imperfect knowledge of the physical model, i.e. MLC/MSD is less robust than the SLC scheme. Moreover, MLC/MSD suffers from error propagation between the different decoding stages, especially if the scheme is designed based on imperfect knowledge of the flash physical model. Furthermore, if the coding scheme is limited to a certain block size then the MLC/MSD scheme, that divides the information bit streams to several blocks, is based on an ECC that is shorter than the EEC of the SLC scheme. Because the performance of ECC improves as the code length increases, the MLC/MSD scheme suffers from inferior performance compared to the SEC scheme in practice.

What is claimed:

1. A method of storing N>1 bits, comprising the steps of:
   (a) configuring a memory device that includes a memory cell to selectively place said memory cell into $M<2^N$ states for representing any integer from 0 through $2^N-1$;
   (b) selecting one of said states to represent the bits; and
   (c) if said memory cell is not in said selected state, programming said memory cell to said selected state.

2. A method of storing N>1 bits, comprising the steps of:
   (a) configuring a memory device that includes a plurality of memory cells to selectively place said memory cells into $M<2^N$ states for representing any integer from 0 through $2^N-1$;
   (b) selecting one of said states to represent the bits; and
   (c) if said memory cells are not in said selected state, programming said memory cells to said selected state.

3. A memory device, for storing N>1 bits, comprising:
(a) a cell; and
(b) a controller operative:
  (i) to selectively place said cell into $M<2^N$ states for representing any integer from 0 through $2^N-1$, and
  (ii) to store the bits in said cell by:
    (A) selecting one of said states to represent the bits, and
    (B) if said cell is not in said selected state, programming said cell to said selected state.

4. A system for storing N>1 bits, comprising:
(a) a memory device that includes a cell; and
(b) a processor operative:
  (i) to selectively place said cell into $M<2^N$ states for representing any integer from 0 through $2^N-1$, and
  (ii) to store the bits in said cell by:
    (A) selecting one of said states to represent the bits, and
    (B) if said cell is not in said selected state, programming said cell to said selected state.

5. A memory device, for storing N>1 bits, comprising:
(a) a plurality of cells; and
(b) a controller operative:
  (i) to selectively place said cells into $M<2^N$ states for representing any integer from 0 through $2^N-1$, and
  (ii) to store the bits in said cells by:
    (A) selecting one of said states to represent the bits, and
    (B) if said cells are not in said selected state, programming said cells to said selected state.

6. A system for storing N>1 bits, comprising:
(a) a memory device that includes a plurality of cells; and
(b) a processor operative:
  (i) to selectively place said cells into $M<2^N$ states for representing any integer from 0 through $2^N-1$, and
  (ii) to store the bits in said cells by:
    (A) selecting one of said states to represent the bits, and
    (B) if said cells are not in said selected state, programming said cells to said selected state.

7. A computer-readable storage medium having computer-readable code embodied in the computer-readable storage medium, the computer-readable code for storing N>1 bits in a memory device that includes a memory cell and that is configured to selectively place said memory cell into $M<2^N$ states for representing any integer from 0 through $2^N-1$, the computer-readable code comprising:
(a) program code for selecting one of said states to represent the bits; and
(b) program code for programming said memory cell to said selected state if said memory cell is not in said selected state.

8. A computer-readable storage medium having computer-readable code embodied in the computer-readable storage medium, the computer-readable code for storing N>1 bits in a memory device that includes a plurality of memory cells and that is configured to selectively place said memory cells into $M<2^N$ states for representing any integer from 0 through $2^N-1$, the computer-readable code comprising:
(a) program code for selecting one of said states to represent the bits; and
(b) program code for programming said memory cells to said selected state if said memory cells are not in said selected state.

* * * * *